(12) United States Patent
Lagahe et al.

(10) Patent No.: US 7,238,598 B2
(45) Date of Patent: Jul. 3, 2007

(54) FORMATION OF A SEMICONDUCTOR SUBSTRATE THAT MAY BE DISMANTLED AND OBTAINING A SEMICONDUCTOR ELEMENT

(75) Inventors: Chrystelle Lagahe, St. Joseph de Riviere (FR); Bernard Aspar, Rives (FR); Aurélie Beaumont, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 141 days.

(21) Appl. No.: 10/530,640

(22) PCT Filed: Oct. 3, 2003

(86) PCT No.: PCT/FR03/50077

§ 371 (c)(1),
(2), (4) Date: Apr. 6, 2005

(87) PCT Pub. No.: WO2004/032183

PCT Pub. Date: Apr. 15, 2004

(65) Prior Publication Data

US 2006/0019476 A1 Jan. 26, 2006

(30) Foreign Application Priority Data

Oct. 7, 2002 (FR) .................................. 02 12443
Apr. 25, 2003 (FR) .................................. 03 50130

(51) Int. Cl.
*H01L 21/425* (2006.01)
(52) U.S. Cl. ...................... 438/514; 438/459; 438/460; 438/473; 438/506; 257/620; 257/797

(58) Field of Classification Search ................ 438/459, 438/460, 68, 369, 370, 473, 506, 514; 257/620, 257/797
See application file for complete search history.

(56) References Cited

U.S. PATENT DOCUMENTS 5,877,070 A 3/1999 Goesele et al.
(Continued)

FOREIGN PATENT DOCUMENTS

EP 0961312 12/1999
(Continued)

OTHER PUBLICATIONS

U.S. Appl. No. 10/048,337 (corresponding to FR 2797347).

*Primary Examiner*—Thao P. Le
(74) *Attorney, Agent, or Firm*—Thelen Reid Brown Raysman & Steiner LLP

(57) ABSTRACT

A method for forming a semiconductor substrate that can be dismantled, comprising the following steps: introduction of gaseous species in the substrate according to conditions enabling the constitution of an embrittled layer by the presence in said layer of micro-cavities and/or micro-bubbles, a thin layer of semiconductor material thus being delimited between the embrittled layer and one face of the substrate, thermal treatment of the substrate to increase the brittleness level of the embrittled layer, said thermal treatment being continued until the appearance of local deformations on said face of the substrate in the form of blisters but without generating exfoliations of the thin layer during this step and during the continuation of the method, epitaxy of semiconductor material on said face of the substrate to provide at least one epitaxial layer on said thin film.

16 Claims, 3 Drawing Sheets

U.S. PATENT DOCUMENTS

| | | | |
|---|---|---|---|
| 6,020,252 | A | 2/2000 | Aspar et al. |
| 6,184,111 | B1* | 2/2001 | Henley et al. ............... 438/514 |
| 6,255,195 | B1* | 7/2001 | Linn et al. .................. 438/455 |
| 6,323,108 | B1* | 11/2001 | Kub et al. .................. 438/458 |
| 6,362,077 | B1* | 3/2002 | Aspar et al. ................ 438/458 |
| 6,429,095 | B1* | 8/2002 | Sakaguchi et al. .......... 438/458 |
| 6,486,008 | B1* | 11/2002 | Lee ............................ 438/149 |
| 6,974,759 | B2* | 12/2005 | Moriceau et al. ........... 438/459 |
| 2002/0187619 | A1* | 12/2002 | Kleinhenz et al. .......... 438/471 |
| 2003/0077885 | A1 | 4/2003 | Aspar et al. |
| 2003/0170990 | A1 | 9/2003 | Sakaguchi et al. |
| 2004/0014299 | A1* | 1/2004 | Moriceau et al. ........... 438/459 |
| 2006/0079071 | A1* | 4/2006 | Moriceau et al. ........... 438/459 |

FOREIGN PATENT DOCUMENTS

| | | |
|---|---|---|
| FR | 2748851 | 11/1997 |
| FR | 2797347 | 2/2001 |
| FR | 2809867 | 12/2001 |
| WO | WO 02/05344 | 1/2002 |

\* cited by examiner

FORMATION OF A SEMICONDUCTOR SUBSTRATE THAT MAY BE DISMANTLED AND OBTAINING A SEMICONDUCTOR ELEMENT

CROSS-REFERENCE TO RELATED APPLICATION

This application claims the benefit of a PCT application PCT/FR03/50077, filed Oct. 3, 2003, which claimed priority of application France 0212443, filed Oct. 7, 2002, and application France 0350130, filed Apr. 25, 2003.

DESCRIPTION

1. Technical Field

The present invention concerns a method for forming a semiconductor substrate that can be dismantled. It further concerns a method for obtaining an element in semiconductor material.

2. State of the Prior Art

Document FR-A-2 681 472 (corresponding to U.S. Pat. No. 5,374,564) describes a method for producing thin films of semiconductor material. It teaches that the introduction of a rare gas or hydrogen into a substrate is capable of inducing, under certain conditions, the formation of micro-cavities or micro-bubbles at a depth close to the average penetration depth of the implanted ions. By bringing into intimate contact this substrate, through its implanted face, with a stiffener and carrying out a suitable thermal treatment, an interaction between the micro-cavities or micro-bubbles present in the implanted zone may take place. This interaction may then lead to a fracture at the level of the implanted zone of the semiconductor substrate. Two parts are then obtained: on the one hand a semiconductor film adhering to the stiffener and, on the other hand, the remainder of the initially implanted substrate. The remainder of the substrate may be recycled and reused. This method makes it possible, in particular, to transfer a thin film of material onto a support substrate that may be of a different nature. In particular, it enables the production of SOI substrates ("Silicon On Insulator").

This process may also be applied to the production of a thin film of solid material other than a semiconductor material, such as for example a conductor or dielectric material, crystalline or not, as disclosed in document FR-A-2 748 850 (corresponding to U.S. Pat. No. 6,190,998).

Furthermore, document FR-A-2 748 851 (corresponding to U.S. Pat. No. 6,020,252) discloses a method that makes it possible to include technological steps requiring the use of high temperatures, for example 900° C., between the initial ion implantation step and the final separation step. These intermediate steps comprising thermal treatments may be carried out without degrading the surface condition of the flat face of the wafer and without leading to fracture at the level of the implanted zone, which would induce the separation of the upper thin film. They may, for example, be part of operations for forming electronic components. In this case, the step of ion implantation, for example of hydrogen, must be carried out within a range of suitable doses. The final separation step may then be achieved either by thermal treatment, or by application of a mechanical stress to the structure, or even by combination of these two treatments.

Document FR-A-2 809 867 discloses a method comprising a step of introducing gaseous species along a buried layer in the substrate, which will lead to the formation of micro-cavities in said layer. The buried implanted zone thus embrittled delimits a thin film with one face of the substrate. The method further comprises a step of eliminating all or part of the gaseous species from the embrittled zone. This evacuation of the gaseous phase allows subsequent treatments to be carried out at high temperatures and this without inducing a deformation of the surface (for example, in the form of blisters) or a total or partial separation of the upper layer. A step of over-embrittlement of the zone of micro-cavities may optionally be realised by carrying out appropriate thermal treatments, by the application of thermal stresses or even by combination of these two types of treatments. This over-embrittlement of the buried zone may for example facilitate the final separation between the upper layer of the substrate and the substrate. The step of implanting gaseous species is carried out in a range of suitable doses that makes it possible to achieve, firstly, a sufficient embrittlement of the buried zone and, secondly, the subsequent elimination of the gaseous species.

In document FR-A-2 758 907 (corresponding to U.S. Pat. No. 6,316,333), the method described makes it possible to transfer a layer of material, for example of silicon, on which it has been possible to form components. The substrate comprising the processed layer is prepared in such a way that certain zones on the surface are masked. The species introduced into this substrate by an ion implantation step is then localised in the non-masked zones. On the other hand, the masked zones to not receive ions. At the level of the implanted zones, one thus obtains a buried layer of specific defects linked to the introduction of gaseous species, such as micro-bubbles, micro-cavities or even micro-fissures. The masked zones may be chosen in such a way as to protect the active zones of the components capable of undergoing a degradation during the crossing of the implanted ions. Typically, the dimensions of the masked zones are described as around 1 µm. The subsequent making integral of the substrate comprising the processed layer and comprising locally implanted regions, followed by a separation treatment, may in particular comprise an annealing at medium temperature (around 400° C.), then enables the active layer of components to be transferred onto a support substrate. Indeed, the development of cavities and micro-fissures at the level of the implanted zones is suited to give rise to the separation over the full wafer of the upper layer.

The results published by C. H. Yun et al. ("Transfer of patterned ion-cut silicon layer", Applied Physics Letters, vol. 73, No. 19, Nov. 1998 and "Ion-cut silicon layer transfer with patterned implantation of hydrogen", Electrochemical Society Proceedings, vol. 99-3, p 125) have shown that the zones masked during the implantation step may result in squares or lines, the maximum dimensions of which are respectively around 15 µm×15 µm and 15 µm×100 µm. The implanted zones separating these masked patterns must be at least 5 µm. The transfer of the upper layer onto a support may then take place, from a thermal treatment or by application of mechanical forces external to the structure. However, the authors note that the transferred upper layer comprises relief inhomogeneities at the level of the non implanted zones. The larger the dimensions (between 10 and 15 µm), the larger are said homogeneities. The authors explain that these irregular reliefs stem from the deviation of the fissure in the cleavage planes (111) of the substrate.

Another method also allows the formation of a substrate that may be dismantled, capable of supporting a high temperature treatment (around 1100° C.) before the final dismantling of the processed upper layer. This method is based on a local implantation, made possible by the use of a mask at the moment of introducing the ions (hydrogen and/or other species such as, for example, noble gases). The size of the implanted regions is devised in such a way that the subsequent thermal treatments for embrittleing the buried zone and/or required for all or part of the steps of forming components does not induce the degradation of the surface. This constraint is linked to the subsequent steps of elaborating components, for example microelectronic components, which necessitates a perfect surface condition.

Obtaining substrates that may be dismantled, in other words comprising an upper layer delimited by the surface of the substrate and by a buried embrittled zone, said substrates being compatible with the implementation of technological steps intended to produce components and that may require high temperature treatments, is of increasing interest. Photovoltaic applications have an additional requirement, which is the use of an inexpensive method.

Document FR-A-2 748 850, cited above, proposes a method for embrittleing a substrate along a buried layer, by introduction at low dose of a gaseous species (for example hydrogen). The implanted dose must be chosen in such a way that a thermal annealing does not induce surface deformation or exfoliation. Depending on the mechanical forces applied to induce the separation, the stage of embrittlement attained at the level of the implanted zone may then turn out to be insufficient. It may then be interesting to increase the brittleness level of the implanted zone.

According to the method described in document FR-A-2 809 867, cited above, the introduction of a controlled dose makes it possible to both embrittle the buried zone then to evacuate the gas, in order to limit a pressure effect during a rise in temperature. One therefore has no deformation or exfoliation of the surface during technological steps at high temperatures. This technique necessitates a strict control of the dose and the homogeneity of the dose of implanted species. It may prove to be interesting to relax the technological constraints relative to a narrow window of implantation parameters.

Document FR-A-2 758 907, cited above, proposes a local introduction of gaseous species after forming components in the upper layer of the substrate. The introduction of these species leads to the formation of a discontinuous buried layer of micro-cavities capable of generating the fracture after making the processed substrate integral on a support substrate. The substrate is therefore embrittled after carrying out the different technological steps of producing the components. The accessible size of the zones to be masked (which correspond to the active zones of the components) may prove limitative depending on the targeted applications. For example, for components of dimensions of several tens of μm to several hundreds of μm, this technique is difficult to implement. Moreover, depending on the technology used for forming the components, the thickness of the active layer, in other words comprising the components, may reach several μm (for example, around 50 μm for photovoltaic cells in silicon). The introduction of gaseous species at a considerable depth while at the same time efficiently protecting the zones by masking may then prove to be awkward, especially due to the equipment that is necessary (specific implanters, accelerator) and costly, for example for photovoltaic applications.

A substrate that may be dismantled may also be formed according to the method described above and using a mask at the moment of introducing the ions. This method employs an intermediate masking step prior to the implantation that will make it possible, by a lateral confinement of the buried micro-fissures, to significantly limit the appearance of deformations in the form of blisters on the surface of the substrate. The surface condition of the substrate is then perfectly compatible with different steps of forming components, for example microelectronic components. On the other hand, this method may have the disadvantage of being costly, particularly in application fields such as the photovoltaic field.

DESCRIPTION OF THE INVENTION

The present invention has been designed with the aim of reducing costs, but keeping as objective obtaining a processed upper layer that may be separated or detached from its substrate without breaking or deteriorating the structure.

The subject of the invention is therefore a method for forming a semiconductor substrate that can be dismantled, comprising the following steps:
  introduction of gaseous species in the substrate according to conditions enabling the constitution of an embrittled layer through the presence in this layer of micro-cavities and/or micro-bubbles, a thin film of semiconductor material thus being delimited between the embrittled layer and one face of the substrate,
  thermal treatment of the substrate to increase the brittleness level of the embrittled layer, said thermal treatment being continued until the appearance of local deformations of said face of the substrate in the form of blisters but without generating exfoliations of the thin film during this step and during the continuation of the method,
  epitaxy of semiconductor material on said face of the substrate to provide at least one epitaxial layer on said thin film.

The introduction of gaseous species may be carried out by ion implantation or plasma immersion implantation.

Before the step of thermal treatment of the substrate, provision may be made for a step of forming a thickener, the thickness of which is sufficiently large so as not to generate exfoliations in the thin film and sufficiently small so as to avoid the separation of the substrate at the level of the embrittled layer during the step of thermal treatment of the embrittled layer. The thickener may then be totally or partially eliminated before the epitaxy step.

Provision may be made for an additional step of subjecting the epitaxial layer to at least one component forming step. This may be a step of forming photovoltaic components.

Provision may also be made for an additional step of forming a protective layer on the epitaxial layer, said protective layer being intended to protect the epitaxial layer from a chemical attack intended for the separation of the substrate at the level of the embrittled layer.

A further aim of the invention is a method for obtaining an element of semiconductor material, characterised in that it comprises the following steps:
  providing a semiconductor substrate that may be dismantled obtained by the method of forming a semiconductor substrate that may be dismantled as described above,
  dismantling the semiconductor substrate that may be dismantled by detaching this substrate at the level of the embrittled layer, the detachment being either total to provide an element of semiconductor material forming a membrane and consisting of the thin film of semiconductor material and the epitaxial layer, or partial to provide one or several elements of semiconductor material forming one or several components and consisting of a part of the thin film of semiconductor material and the epitaxial layer.

Provision may also be made for a supplementary step of attaching the epitaxial layer onto a support before the dismantling step.

The detachment may result from the application of a tensile stress and/or a shear stress. It may result from the implementation of a step of introducing additional gaseous species into the embrittled layer, then a step of mechanical stressing and/or thermal treatment of the embrittled layer. It may also result from the application of an opening stress at the level of the embrittled layer. It may also result from a chemical attack of the embrittled layer. It may also result from a combination of these methods.

The step of providing a semiconductor substrate that may be dismantled may comprise a substrate that has already been dismantled and that is obtained by the above method of forming a semiconductor substrate that may be dismantled and without prior surface conditioning.

BRIEF DESCRIPTION OF DRAWINGS

The invention will be more fully understood and other advantages and particularities will become clear on reading the following description, given by way of example and in nowise limitative and by referring to the appended drawings, among which.

DETAILED DESCRIPTION OF SPECIFIC EMBODIMENTS

Figure 1:
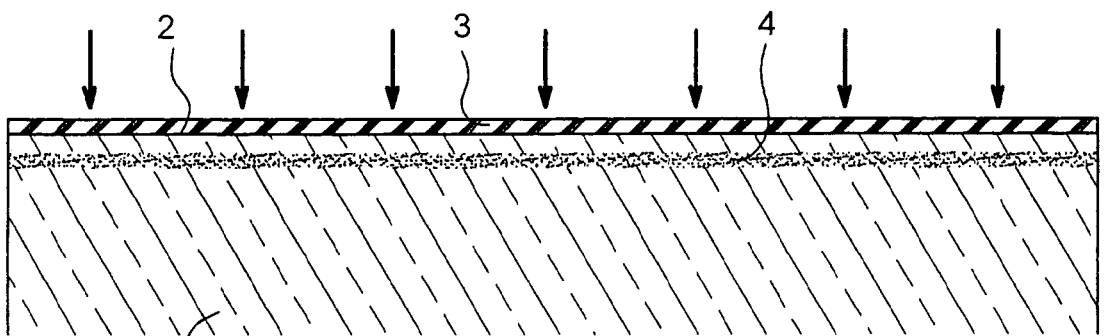
FIG. 1 is a cross-sectional view of a semiconductor substrate subjected to an ion implantation intended to form a buried embrittled layer, according to the invention.

The method according to the invention applies in particular to the field of photovoltaic applications. It enables a substrate to be formed (in particular in silicon) comprising an embrittled buried layer, which may undergo the different steps of epitaxial growth and elaboration of cells, specific to the targeted photovoltaic application, then allow the final separation between the processed upper layer and the remainder of the substrate.

This method is based on the implantation of gaseous species such as ions of hydrogen and/or noble gases, capable of creating, around the depth of maximum concentration, a zone embrittled by micro-cavities, "platelets" and/or micro-bubbles. A thermal treatment making it possible to increase the brittleness level of the embrittled layer is carried out. Said thermal treatment will henceforth be called embrittlement thermal treatment. Under certain conditions, said embrittlement thermal treatment imposed on the implanted substrate has the consequence of forming cavities and/or micro-fissures in the buried embrittled zone leading to the appearance of blisters or bubbles on the surface of the substrate.

According to the method of the invention, the implantation conditions (the principal parameters of which are the energy, the dose and the temperature) as well as the parameters of the embrittlement thermal treatment and different, optional, subsequent steps of preparing the substrate (thermal treatments, deposition of layers, etc.) must be chosen as a function of the nature of the substrate (nature of the material, crystalline orientation, etc.), in such a way that no exfoliation of the upper layer appears. Exfoliation is taken to mean a partial detachment of the thin film at the level of the embrittled zone. In the same way, during the technological steps specific to the targeted application, for example during a step of epitaxial growth of the layer of silicon necessary for forming solar cells, no exfoliation will be generated.

After all or part of the forming of the photovoltaic components, and in compliance with certain implementations described hereafter, the processed upper layer (around 50 µm) may be dissociated from the initial substrate by embrittlement at the level of the embrittled zone by the micro-cavities and/or micro-fissures.

The method begins by the creation of a buried embrittled layer that will allow, after technological steps have been carried out, the separation between an upper layer and the remainder of the substrate. It is based on the introduction in the substrate of gaseous species such as hydrogen and/or other noble gases (helium, etc.) by a technique allowing a controlled localisation of the species in depth (for example, ion implantation, plasma immersion implantation, etc.). Such an implantation makes it possible to form a buried embrittled zone typically composed of micro-cavities, "platelets" and/or micro-bubbles. This buried, disrupted zone delimits, with the surface of the substrate, an upper layer.

With the aim of increasing the brittleness level of the implanted zone, optional steps of preparing the substrate comprising for example, a thermal treatment and/or a deposition of thickener may be carried out on the substrate before the embrittlement thermal treatment.

Indeed, under thermal activation, the micro-cavities and/or "platelets", generated during the implantation, for example of hydrogen ions, are going to follow a growth law. Thus, if the implanted dose is sufficient, the cumulative effect of the increase in the size of the cavities and/or the micro-fissures and the gas pressure in them is the appearance of local deformations of the upper layer in the form of blisters.

The characteristics (morphology, size, density) of said micro-fissures and/or cavities reflect the state of embrittlement of the implanted zone.

According to a variant of the embrittlement treatment, one may form a deposit of oxide on the surface of the implanted substrate before any thermal treatment. This will play a mechanical role of thickener, which allows the micro-fissures to develop laterally along larger dimensions, under the effect of a suitable thermal annealing. Characteristics of micro-fissures favourable to a higher embrittlement may be obtained by the addition of said deposited layer.

For a given substrate, the parameters of implantation, embrittlement thermal treatment and the parameters for conditioning the substrate (thermal treatments, deposition of layers acting as thickeners, etc.), determine the size and the density of the blisters on the surface of the substrate, in other words also the size and density of the underlying micro-fissures and/or cavities, contained within the implanted zone.

The level of embrittlement of the substrate can also be configured as a function of the implantation conditions and the characteristics of the subsequent treatments.

Thus, for a given substrate, it is necessary to choose the implantation conditions (energy, dose, temperature) in such a way that:
- the carrying out of a suitable embrittlement treatment effectively leads to obtaining micro-fissures of large dimension, capable of generating blisters on the surface of the substrate. However, this treatment must not in any case generate exfoliations of the upper layer.
- any subsequent treatment, linked to the technological steps specific to the targeted application, for example epitaxy in the range 550° C.–1100° C., does not induce the local exfoliation of the layer.

The method according to the invention combines implantation conditions and embrittlement treatments that make it possible to avoid the local exfoliation of the upper layer before and after the different technological steps relating to the targeted application.

All of the implantation conditions and treatments enabling the embrittlement to be increased must make it possible to obtain a substrate comprising localised micro-fissures in the implanted zone, giving rise to the appearance of blisters on its surface. Said micro-fissures are randomly distributed in the buried embrittlement plane and their size follows a Gaussian distribution law. This state of embrittlement is such that any additional treatment imposed on the substrate, including in particular high temperature treatments, does not induce local exfoliation of the upper layer delimited by the implanted zone and the surface of the substrate, for example at the level of one or several micro-fissures.

It is important to note that the morphology, the size and the density of the micro-fissures and cavities present in the embrittled layer may be variable depending on the subsequent treatments imposed on the embrittled substrate. The high thermal budgets for which the reconstruction of the material constituting the substrate is significant, have a notable influence on the morphological change of the micro-fissures formed after the implantation, followed by an embrittlement treatment requiring a low thermal budget. After high thermal budgets, said micro-fissures and/or cavities evolve towards stable polyhedral shapes. One notes in particular a polyhedric type reconstruction of the edges of fissures. Their sizes and densities also strongly depend on the thermal budget imposed on the embrittled substrate. One may note that the step of embrittlement may also comprise a high temperature thermal treatment, in such a way as to transform the micro-fissures and/or cavities present in the implanted zone into stable objects (evacuation of all or part of the gaseous species and at least partial reconstruction of the edges of fissures). This has the aim of avoiding any phenomenon of exfoliation during the technological steps of epitaxy and/or forming of components.

At this stage, and in order to allow the elaboration of components, for example photovoltaic components, the epitaxial growth of a thick layer of silicon (up to around 50 µm), may be carried out on the blistered substrate. The "mild" relief of the surface blisters (typically of a diameter ranging from several µm to several tens of µm and in which the maximum deformation may reach several hundreds of nanometers) allows thick layers of monocrystalline silicon of good quality for the targeted application to be obtained by epitaxy.

Different steps of elaborating photovoltaic type components may then be carried out.

The continuation of the method corresponds to the final separation between the upper layer and the initial substrate. This separation will take place at the level of the embrittled buried zone.

This step may be carried out by application of a tensile stress, shear stress or mixed mode involving both tensile and shear stress, to the embrittled zone.

According to a first embodiment, the upper processed layer may be separated from its source-substrate, thus generating a self-supporting membrane. Said membrane may be separated over the whole surface area of the substrate or instead locally at the level of a component or an assembly of components, by application of an opening stress at the level of the embrittled zone.

According to a second embodiment, a low cost support substrate could be linked by means of an adhesive layer (polymer, resin, ceramic, metallic or other, etc.) to the processed silicon layer. The separation, for example by application of tensile and/or shear stresses and/or according to a mixed mode to the bonded structure may then be carried out at the level of the buried embrittled zone.

One then obtains:
- the initial substrate on the one hand, peeled from a thin film (said film being the zone delimited by the implanted zone and the surface of the initial substrate),
- and the support on the other hand, comprising the processed membrane of semiconductor material (for example of silicon).

According to a variant of the method and in order to facilitate the final dissociation of the membrane of the initial substrate, a chemical attack may be carried out. A SECCO® type solution has the property of attacking the silicon and more preferentially the zones of stressed silicon and/or having undergone plastic deformations and/or disrupted by the presence of inclusions, structurings or other morphological transformations. Thus, the embrittled zone comprising micro-fissures and/or cavities, the lateral size of which may vary from around several tens of nanometers to several tens of µm, will be a privileged zone of attack of the SECCO® solution. In this way it is possible to initiate a dissociation of the processed upper layer of the initial substrate, by a progressive localised consumption by the chemical solution of the buried embrittled zone. According to this variant of the separation step, it will be necessary to carry out the deposition of a protective layer, particularly on the upper processed face of the substrate, in such a way as to avoid the degradation of the cells and/or components formed.

Other solutions allowing the etching of the semiconductor material at the level of the embrittled zone may also be used providing that the processed parts of the substrate are protected in an efficient manner. One may, in particular, cite TMAH and KOH if the semiconductor material is of silicon.

According to a variant of the method, this step consisting in a localised attack at the level of the embrittled zone, may be carried out before the forming of components (for example, photovoltaic cells). Thus, it will not be necessary to take precautions to protect the processed face of the embrittled substrate.

This technique of preferential chemical attack may be used alone to totally separate the processed membrane from its initial substrate, this with the aim of obtaining a self-supporting layer, or instead with the aim of transferring said membrane onto an inexpensive mechanical support.

According to a variant, this technique of chemical attack may be used jointly with a mechanical separation technique by application of external forces such as, for example, tensile forces. In this case, the chemical attack will have the advantage of initiating and localising the fissure at the level of the buried embrittled zone and thus facilitating the final dissociation.

According to a variant, one could subject the substrate to treatments by sound waves (ultrasounds, nanovibrations, etc.).

According to a variant of the method, one may carry out a treatment intended to diffuse the gaseous species, for example of hydrogen, through the front or rear face of the processed substrate. The techniques used may be, for example, plasma hydrogenation, or other methods for introducing gaseous species by diffusion. This step may enable the brittleness level of the buried zone of micro-fissures and/or micro-cavities to be increased. The species introduced into the material are preferentially trapped at the level of the micro-fissures zone.

The final separation may then be realised by a suitable thermal treatment and/or by application of a suitable mechanical stress and/or by a treatment comprising both a thermal treatment and a mechanical treatment.

The initial substrate peeled from an upper layer may then be recycled in order to form another substrate to be embrittled.

It should be noted that, in an advantageous manner, no surface conditioning treatment (for example, polishing) will be necessary on said recycled substrate. The introduction of gaseous species may be carried out directly in the substrate, the surface of which has a micro-roughness linked to the dissociation step.

FIG. 1 is a cross-sectional view of a semiconductor substrate 1, in this example it is a substrate in silicon, which is going to be subjected to the method of the invention, according to a first embodiment. The principal face 2 of the substrate of silicon 1 is covered with a layer of silicon oxide 3.

An ion implantation of hydrogen, symbolically represented by arrows in FIG. 1, is carried out in the substrate 1 through the oxide layer 3. The implantation beam has an energy of 210 keV and a dose of $6.10^{16} H^+/cm^2$. It gives rise to the formation of a buried embrittled layer 4 comprising micro-bubbles and micro-cavities.

Figure 2:
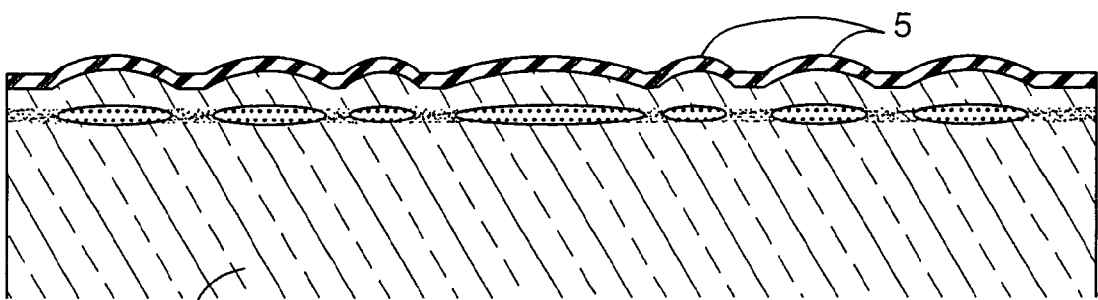
FIG. 2 is a cross-sectional view of the semiconductor substrate of FIG. 1 having undergone a thermal treatment making it possible to increase the brittleness level of the buried embrittled layer, according to the invention.

An annealing at 550° C. for 30 minutes is carried out on said substrate in order to increase the brittleness level of the implanted zone. Indeed, under thermal activation, the cavities induced by the implantation follow a law of growth to form micro-fissures and/or cavities of greater size that give rise to the appearance of blisters 5 on the surface of the substrate as shown in FIG. 2.

Figure 3:
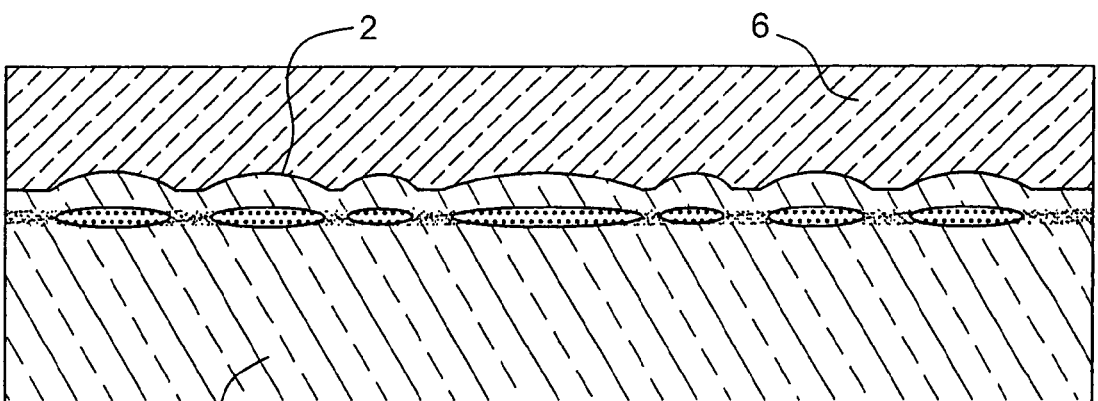
FIG. 3 is a cross-sectional view of the semiconductor substrate of FIG. 2 after the epitaxy of a layer of semiconductor material on all the implanted face of the substrate, according to the invention.

The oxidised surface of the substrate is then deoxidised, then a technological step of liquid phase or vapour phase silicon epitaxy is carried out. FIG. 3 shows the presence of an epitaxial layer 6 on the principal face 2 of the substrate 1. The thickness of the epitaxial layer 6 may be 50 μm. The liquid phase epitaxy may be carried out at a temperature of around 950° C. for 2 hours. The vapour phase epitaxy may be carried out around 1100° C. for 1 hour.

According to a second embodiment of the invention, the ion implantation of hydrogen is carried out for an energy of 76 keV and a dose of $6.10^{16} H^+/cm^2$ through a 400 nm layer of silicon oxide covering a silicon substrate. A PECVD deposition is then carried out to obtain an additional layer of silicon oxide 3 μm thick. This substrate may then undergo an embrittlement treatment such as an increasing temperature annealing going from 400° C. up to 1100° C., the rise in temperature being, for example, 3° C./min and the time of treatment at 1100° C. being one hour. This treatment has the effect of making the cavities and/or micro-fissures grow at the level of the implanted zone then of stabilising these cavities and/or micro-fissures at high temperature so that no modification takes place of the state of the surface condition of the substrate during the removal of the thick layer of oxide or during subsequent technological steps.

The oxidised surface of the substrate is then deoxidised, prior to a technological step of liquid or vapour phase epitaxy of silicon, of a thickness between 20 μm and 50 μm.

According to a third embodiment of the invention, the implantation of hydrogen is carried out by plasma immersion for an energy of 76 keV and a dose of $6.10^{16} H^+/cm^2$ through a layer of silicon oxide of 400 nm covering a silicon substrate. A PECVD deposition is then carried out to obtain an additional layer of silicon oxide 3 μm thick. This substrate may then undergo an embrittlement treatment such as an increasing temperature annealing going from 400° C. up to 1100° C., the rise in temperature being, for example, 3° C./min.

The oxidised surface of the substrate is then partially deoxidised. The oxide is for example removed from the central part of the substrate but remains on a crown on the edge of the substrate, of a width that may vary from several hundreds of μm to several mm. A step of liquid phase epitaxy to obtain an epitaxial layer of thickness between 20 μm and 50 μm is then carried out.

Figure 4:
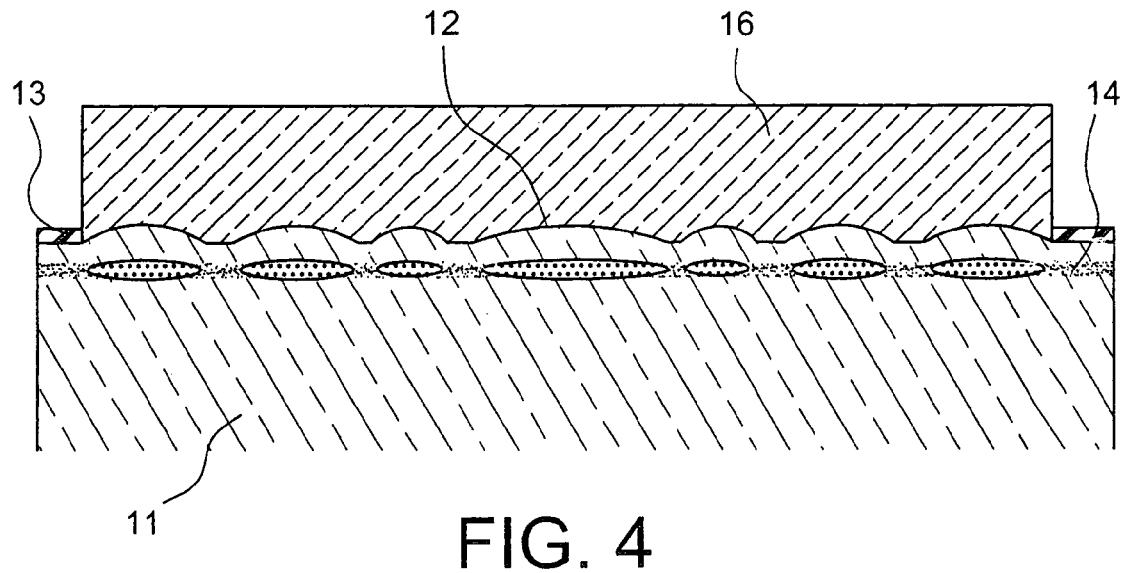
FIG. 4 is a cross-sectional view of the semiconductor substrate of FIG. 2 after the epitaxy of a layer of semiconductor material on a part of the implanted face of the substrate, according to the invention.

FIG. 4 illustrates this third embodiment of the invention. It shows a substrate in silicon 11 comprising a buried embrittled layer 14, a layer of oxide 13 remaining as a crown on the substrate 11 and an epitaxial layer 16 deposited on the part of the face 2 of the substrate not covered with oxide. It can be clearly seen that on the crown 13 the resumption of epitaxy has not taken place.

According to a fourth embodiment of the invention, the ion implantation of hydrogen is carried out for an energy of 210 keV and a dose of $7.10^{16} H^+/cm^2$ through a layer of silicon oxide of 200 nm covering a silicon substrate. A deposition by PECVD is then carried out to obtain an additional layer of silicon oxide of 10 μm thickness.

This substrate may then undergo an embrittlement annealing at 450° C. for 14 hours, followed by an increase at 3° C./min up to 1100° C.

The oxidised surface of the substrate is then partially deoxidised. The oxide is for example removed from the central part of the substrate but remains on a crown at the edge of the substrate, of a width that may range from several hundreds of μm to several mm. A step of vapour phase epitaxy of silicon to obtain an epitaxial layer of thickness between 20 and 50 μm is then carried out.

After this step, the substrate comprises a central part on which the resumption of epitaxy of monocrystalline silicon has been possible due to the fact of the de-oxidation prior to the epitaxy. The substrate thus comprises, on its peripheral part, the crown of silicon oxide on which the resumption of epitaxy has taken place in polycrystalline form.

According to a fifth embodiment of the invention, the implantation of hydrogen by plasma immersion is carried out for an energy of 76 keV and a dose of $6.10^{16} H^+/cm^2$ through a 400 nm layer of silicon oxide covering a double faced polished silicon substrate. The implantation is carried out on the two principal faces of the substrate. A PECVD deposition of oxide of 3 μm is carried out on said double faced implanted substrate. This substrate then undergoes an embrittlement treatment such as an increasing temperature annealing going from 400° C. up to 1100° C., the rise in temperature being, for example, 3° C./min.

The oxidised surfaces of the substrate are then partially deoxidised. In particular, the oxide is removed from a central part of the two faces of the substrate but remains on a crown on the edge of a width that may vary from several hundreds of μm to several mm. A technological step of liquid phase epitaxy, of a thickness between 20 μm and 50 μm is then carried out, on the two faces of the substrate. After this step, the substrate comprises a central part on which the resumption of epitaxy has been possible due to the fact of the de-oxidation prior to the epitaxy. The substrate comprises, on the peripheral part of its faces, the deposited crown of PECVD oxide on which the resumption of epitaxy has not been possible.

Figure 5:
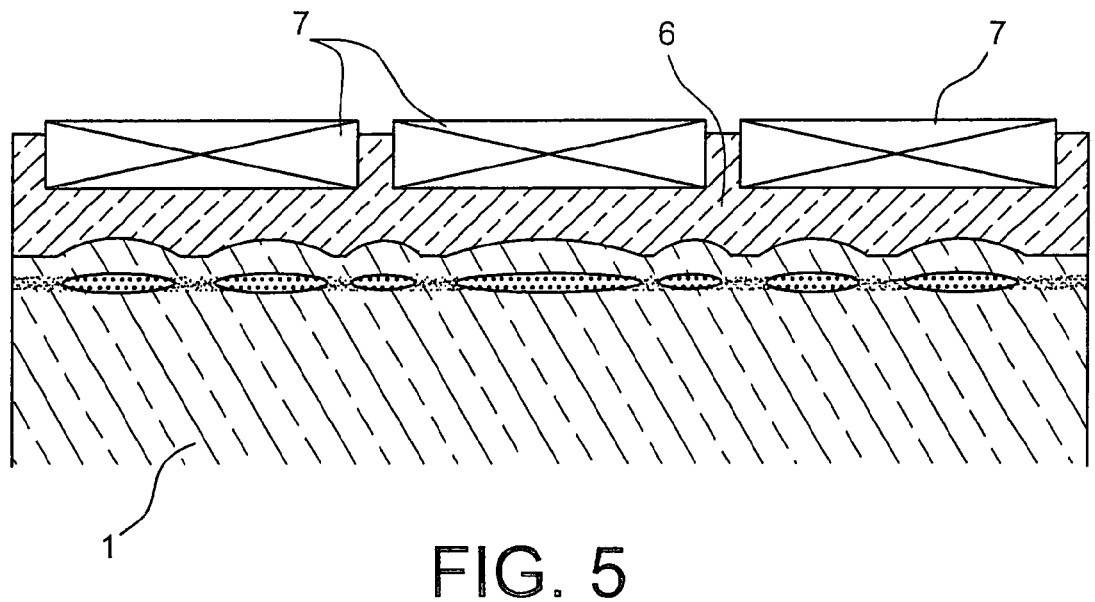
FIG. 5 is a cross-sectional view of the semiconductor substrate of FIG. 3 after forming components in the epitaxial layer, according to the invention.

According to a sixth embodiment of the invention, the ionic implantation of hydrogen is carried out for an energy of 52 keV and a dose of $5.5.10^{16}$ $H^+/cm^2$ through a 200 nm layer of silicon oxide covering a silicon substrate. A PECVD deposition is then carried out to obtain an additional layer of oxide 5 μm thick. The substrate may then undergo an embrittlement annealing at 500° C. for 4 hours. The oxidised surface of the substrate is then totally deoxidised. A liquid phase epitaxy step at 600° C. may then be carried out with the aim of obtaining an epitaxial layer of between 20 μm and 50 μm Whatever the embodiment of the invention, technological steps of forming components, for example photovoltaic components, may be implemented. FIG. 5 shows components 7 formed in the epitaxial layer 6 of the substrate represented in FIG. 3. If the epitaxy has been carried out on the two principal faces of the substrate, components may then be formed in the two epitaxial layers.

Figure 6:
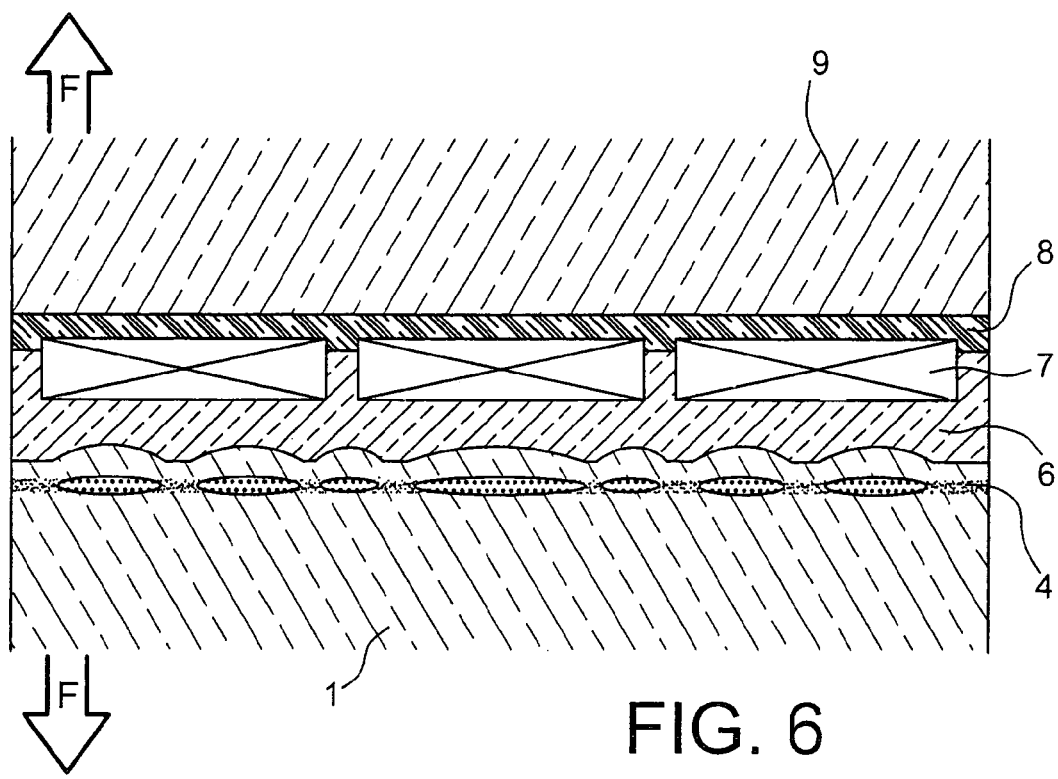
FIG. 6 is a cross-sectional view of the semiconductor substrate of FIG. 5 after attachment of the epitaxial layer on a support, according to the invention.

The substrate thus processed is then made integral by means of a ceramic adhesive 8, for example on a mechanical support 9 such as a ceramic, glass or mullite substrate as shown in FIG. 6. The insertion in the region of the embrittled layer 4 of a suitable tool comprising for example a bevelled blade will then enable a cut to be made at the level of the buried implanted zone, thus separating the processed layer 6 from its initial substrate 1, and leaving it integral with the substrate support 9. The initial substrate 1 may then be recycled into a new substrate to be embrittled.

Figure 7:
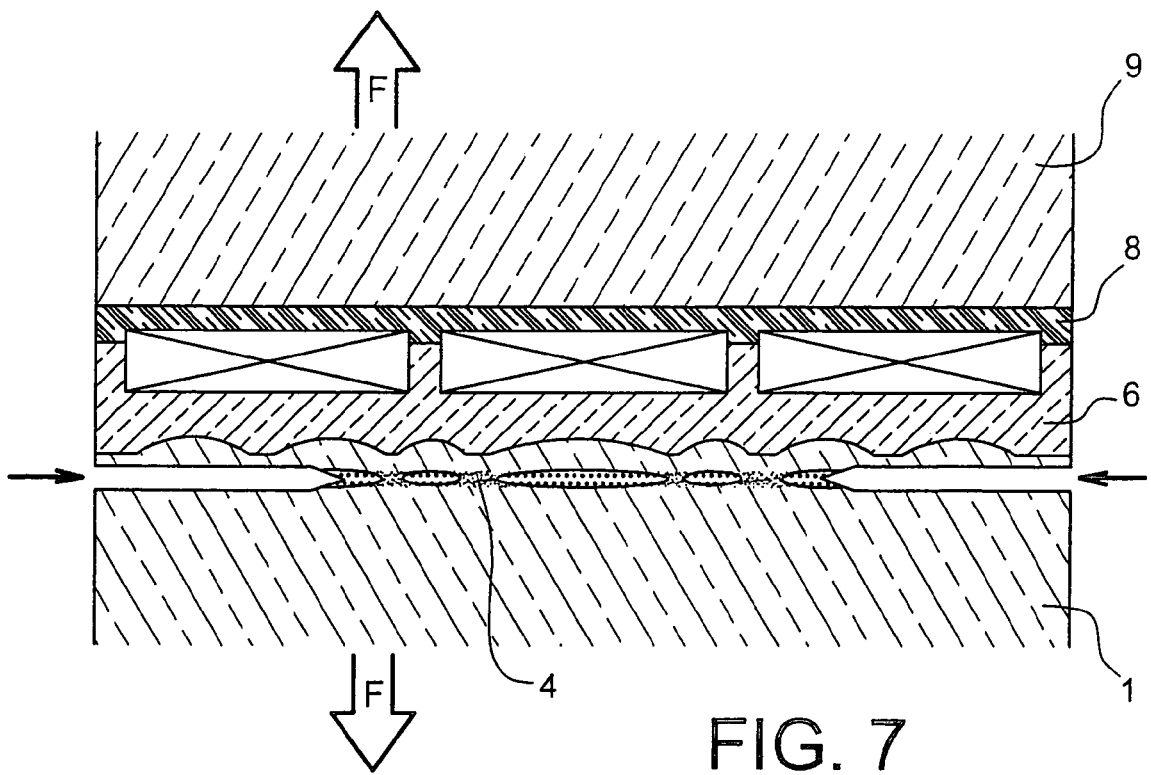
FIG. 7 is a cross-sectional view of the semiconductor substrate fixed to its support, as shown in FIG. 6, during the step of separation, according to the invention.

The processed substrate of the second embodiment of the invention may be made integral by means of a polymer adhesive on a mechanical support such as a plastic substrate. The immersion of the bonded structure in a solution, for example of SECCO®, provokes the preferential attack of the polycrystalline silicon, the crown of oxide and the buried embrittled zone, which may initiate the separation between the processed layer from its initial substrate. The separation may take place completely according to this chemical route or instead be assisted by the application of a mechanical stress or instead be relayed by a purely mechanical opening route using tensile and/or shear stresses as indicated by the arrows F in FIGS. 6 and 7. The initial substrate may then be recycled into a new substrate to be embrittled.

The processed substrate of the third embodiment of the invention may be made integral by means of a polymer adhesive on a mechanical support such as a plastic substrate. The bonded structure may then be immersed in a bath of HF. This has the effect of attacking the peripheral layer of oxide present on the processed embrittled substrate. Thus, the application of the stress during the insertion of a blade is better localised at the level of the embrittled zone. One then ends up with the separation between the processed layer and its initial substrate. The initial substrate could then be recycled into a new substrate to be embrittled.

The processed substrate of the fourth embodiment of the invention may be made integral by means of a polymer adhesive on a mechanical support such as a plastic substrate. The immersion of the bonded structure in a solution, for example of SECCO®, provokes the preferential attack of the polycrystalline silicon, the crown of oxide and the buried embrittled zone, which may initiate the separation between the processed layer from its initial substrate. The separation may take place completely according to this chemical route or instead be assisted by the application of a mechanical stress or instead be relayed by a purely mechanical opening route using tensile and/or shear stresses as indicated by the arrows F in FIGS. 6 and 7. The initial substrate may then be recycled into a new substrate to be embrittled.

The processed substrate of the fifth embodiment of the invention may be made integral by means of a polymer adhesive on a mechanical support such as a plastic substrate. The bonded structure is then immersed in a bath of HF. This has the effect of attacking the peripheral oxide layer present on each of the faces of the processed embrittled substrate. The application of the stress during the insertion of a blade will be better localised at the level of the embrittled zone. This stress will be successively or jointly applied in the region of the embrittled layer of one or other face of the substrate. One then ends up with the separation between the processed layers and the initial substrate. The initial substrate may then be recycled into a new substrate to be embrittled.

The invention claimed is:

1. Method for forming a semiconductor substrate that may be dismantled, comprising the following steps:
   introduction of gaseous species in the substrate according to conditions allowing the constitution of an embrittled layer by the presence in said layer of micro-cavities and/or micro-bubbles, a thin film of semiconductor material thus being delimited between the embrittled layer and one face of the substrate,
   thermal treatment of the substrate to increase the brittleness level of the embrittled layer, said thermal treatment being continued until the appearance of local deformations on said face of the substrate in the form of blisters but without generating exfoliations of the thin film during this step and during the continuation of the method,
   epitaxy of semiconductor material on said face of the substrate to provide at least one epitaxial layer on said thin film.

2. Method according to claim 1, characterised in that the introduction of gaseous species is carried out by ion implantation or plasma immersion implantation.

3. Method according to claim 2, characterised in that the introduction of gaseous species is carried out by plasma immersion implantation, the method is applied on two faces of the substrate.

4. Method according to claim 1, characterised in that, before the step of thermal treatment of the substrate, it provides for a step of forming a thickener, the thickness of which is sufficiently large so as not to generate exfoliations in the thin film and sufficiently small to avoid the separation of the substrate at the level of the embrittled layer during the step of thermal treatment of the substrate.

5. Method according to claim 4, characterised in that the thickener is totally or partially eliminated before the epitaxy step.

6. Method according to claim 1, characterised in that it provides for an additional step of subjecting the epitaxial layer to at least one step of forming components.

7. Method according to claim 6, characterised in that said step of forming components is a step of forming photovoltaic components.

8. Method according to claim 1, further comprising forming a protective layer on the epitaxial layer, said protective layer being intended to protect the epitaxial layer from a chemical attack intended for the separation of the substrate at the level of the embrittled layer.

9. Method according to claim 1, wherein
dismantling of the semiconductor substrate that may be dismantled by detachment of this substrate at the level of the embrittled layer, the separation being either total to provide an element of semiconductor material forming a membrane and consisting of the thin film of semiconductor material and the epitaxial layer, or partial to provide one or several elements of semiconductor material forming one or several components and consisting of a part of the thin film of semiconductor material and the epitaxial layer.

10. Method according to claim 9, characterised in that it provides for an additional step of fastening of the epitaxial layer onto a support before the step of dismantling.

11. Method according to claim 9, characterised in that the detachment results from the application of a tensile stress and/or a shear stress.

12. Method according to claim 9, characterised in that the detachment results from the implementation of a step of introducing additional gaseous species into the embrittled layer, then a step of mechanical stress and/or thermal treatment of the embrittled layer.

13. Method according to claim 9, characterised in that the detachment results from the application of an opening stress at the level of the embrittled layer.

14. Method according to claim 9, characterised in that the detachment results from a chemical attack of the embrittled layer.

15. Method according to claim 9, characterised in that the detachment results from a treatment by sound waves of the embrittled layer.

16. Method according to claims 9, further comprising providing a substrate that has already been dismantled and that is obtained with prior surface conditioning.

* * * * *